United States Patent [19]

Nakagawa

[11] Patent Number: 5,729,567
[45] Date of Patent: Mar. 17, 1998

[54] MULTILAYER FILM STRUCTURE AND VERTICAL CAVITY SURFACE EMITTING LASERS

[75] Inventor: Shigeru Nakagawa, Kawasaki, Japan

[73] Assignee: Hewlett-Packard Company, Palo Alto, Calif.

[21] Appl. No.: 637,955

[22] Filed: Apr. 25, 1996

[30] Foreign Application Priority Data

Apr. 28, 1995 [JP] Japan ................................. 7-129595

[51] Int. Cl.$^6$ .............................. H01S 3/08; H01L 21/20
[52] U.S. Cl. .............................. 372/99; 372/43; 372/50; 372/92; 372/96; 437/129
[58] Field of Search .................... 372/43, 44, 45, 372/46, 48, 49, 50, 92, 96, 99, 107; 437/129

[56] References Cited

U.S. PATENT DOCUMENTS

| | | | |
|---|---|---|---|
| 5,063,569 | 11/1991 | Xie | 372/45 |
| 5,216,684 | 6/1993 | Wang et al. | 372/45 |
| 5,244,749 | 9/1993 | Bean et al. | 428/620 |
| 5,263,040 | 11/1993 | Hayakawa | 372/45 |
| 5,295,147 | 3/1994 | Jewell et al. | 372/45 |
| 5,337,326 | 8/1994 | Kan et al. | 372/45 |
| 5,341,390 | 8/1994 | Yamada et al. | 372/45 |
| 5,363,392 | 11/1994 | Kasukawa et al. | 372/45 |
| 5,412,680 | 5/1995 | Swirhun et al. | 372/45 |
| 5,561,680 | 10/1996 | Haberern et al. | 372/46 |

OTHER PUBLICATIONS

Kinoshita, Susumu et al., "GaAl As/GaAs Surface Emitting Laser with High Reflective TiO$_2$/SiO$_2$ Multilayer Bragg Reflector" Japanese Journal of Applied Physics, vol. 26, No. 3, Mar. 1987, pp. 410–415.

Gourley, P. L., et al., "Epitaxial Surface–Emitting Laser on a Lattice–Mismatched Substrate", Applied Physics Letters, vol. 60, No. 17, Apr. 27, 1992, New York, pp. 2057–2059.

Chua, C. L. "Dielectrically–Bonded Long Wavelength Vertical Cavity Laser on GaAs Substrates Using Strain–Compensated Multiple Quantum Wells", IEEE Photonics Technology Letters, vol. 6, No. 12, Dec. 1994, New York, pp. 1400–1402.

Park, Seoung–Hwan et al., "Strain–Compensated InGaAs/In GaAsP Quantum Well Lasers Lattice Matched to GaAs", Applied Physics Letters, vol. 66, No. 2, Jan. 1995, pp. 201–203.

Takiguchi, T. et al., "Improvement of Crystal Quality and Laser Characteristics by Zero Net Strain Structure", Journal of Crystal Growth, vol. 145, Noss 1–4, Amsterdam, pp. 892–897. No Date.

Tamanuki, Takemasa et al., "Temperature Characteristics of Short–Cavity AlGaAs/GaAs Surface Emitting Lasers", IEICE Transactions, vol. E 74, No. 11, pp.3867–3869. No Date.

*Primary Examiner*—Brian Healy

[57] ABSTRACT

First and second layers are alternately laminated on the semiconductor substrate, providing a multilayer structure in which the resultant residual stress in the layered structure is significantly decreased. One embodiment of the invention is applied to a vertical cavity surface emitting laser having a dielectric multilayer mirror comprised of pairs of a first layer (SiO$_2$ layer) and a second layer (TiO$_2$ layer). Each layer has a prescribed thickness and is formed by deposition on a semiconductor (GaAs) substrate. When the layers are deposited on the semiconductor substrate, the first layer is preferably formed to exhibit a residual compressive stress, while the second layer is preferably formed to exhibit a residual tensile stress having a magnitude that is equal to or almost equal to the residual compressive stress of the first layer.

20 Claims, 2 Drawing Sheets

5,729,567

MULTILAYER FILM STRUCTURE AND VERTICAL CAVITY SURFACE EMITTING LASERS

BACKGROUND OF THE INVENTION

1. Technical Field

The invention relates to semiconductor lasers. More particularly, the invention relates to a multilayer film structure for vertical cavity surface emitting lasers.

2. Description of the Prior Art

The efficiency of a semiconductor laser is greatly affected by both the reflectivity of the laser mirrors and defects in the active layer of the laser. In a vertical cavity surface emitting laser, dielectric multilayer structures or semiconductor multilayer structures are used as the mirrors.

It is possible to fabricate a semiconductor laser in which the mirror reflectivity is increased without producing defects in the active layer. For example, a dielectric multilayer mirror may be fabricated by alternately laminating a first layer, composed of $SiO_2$, and a second layer, composed of $TiO_2$. In a vertical cavity surface emitting laser, these layers are usually laminated by deposition on a semiconductor substrate composed of GaAs or Si, or a substrate such as an etching strip layer. It is thought that in such case the threshold current should be less than 1 mA, and the second harmonic output power should be greater than 1 mW.

Conventionally, when a dielectric multilayer mirror is fabricated by alternately laminating the $SiO_2$ layer and $TiO_2$ layer, the deposition of $SiO_2$ and $TiO_2$ is performed at a high temperature to increase the mirror reflectivity. As a result, the entire mirror is compressed or expanded in a direction parallel to the layer surface. This curves the semiconductor substrate that forms the mirror. Strain and cracks are produced in the semiconductor substrate and, particularly, in the laser's active layer. When such cracks occur, the recombination of carriers without light emission readily occurs. Thus, the current threshold value increases and the light output, i.e. fundamental waves and second harmonics, decreases. This gives rise to an increase in laser temperature and an increase in the threshold current.

It would therefore be advantageous to provide a multilayer structure for a semiconductor laser that decreases residual stress that occurs when the laser is synthesized.

SUMMARY OF THE INVENTION

The invention provides a process that can significantly decrease residual stress which occurs when a layered laser structure, in which first and second layers are alternately deposited on a semiconductor substrate, is synthesized. The invention also provides a multilayer structure for a vertical cavity surface emitting laser that uses mirrors.

The preferred multilayer structure is a vertical cavity surface emitting laser that has a dielectric multilayer mirror comprised of pairs of a first layer ($SiO_2$ layer) and a second layer ($TiO_2$ layer). Each layer has a prescribed thickness, formed by deposition on a semiconductor (GaAs) substrate. When the layers are deposited on the semiconductor substrate, the first layer is preferably formed with a residual compressive stress, while the second layer is preferably formed with a residual tensile stress having a magnitude that is equal to or almost equal to the residual compressive stress of the first layer.

DETAILED DESCRIPTION OF THE INVENTION

Figure 1:
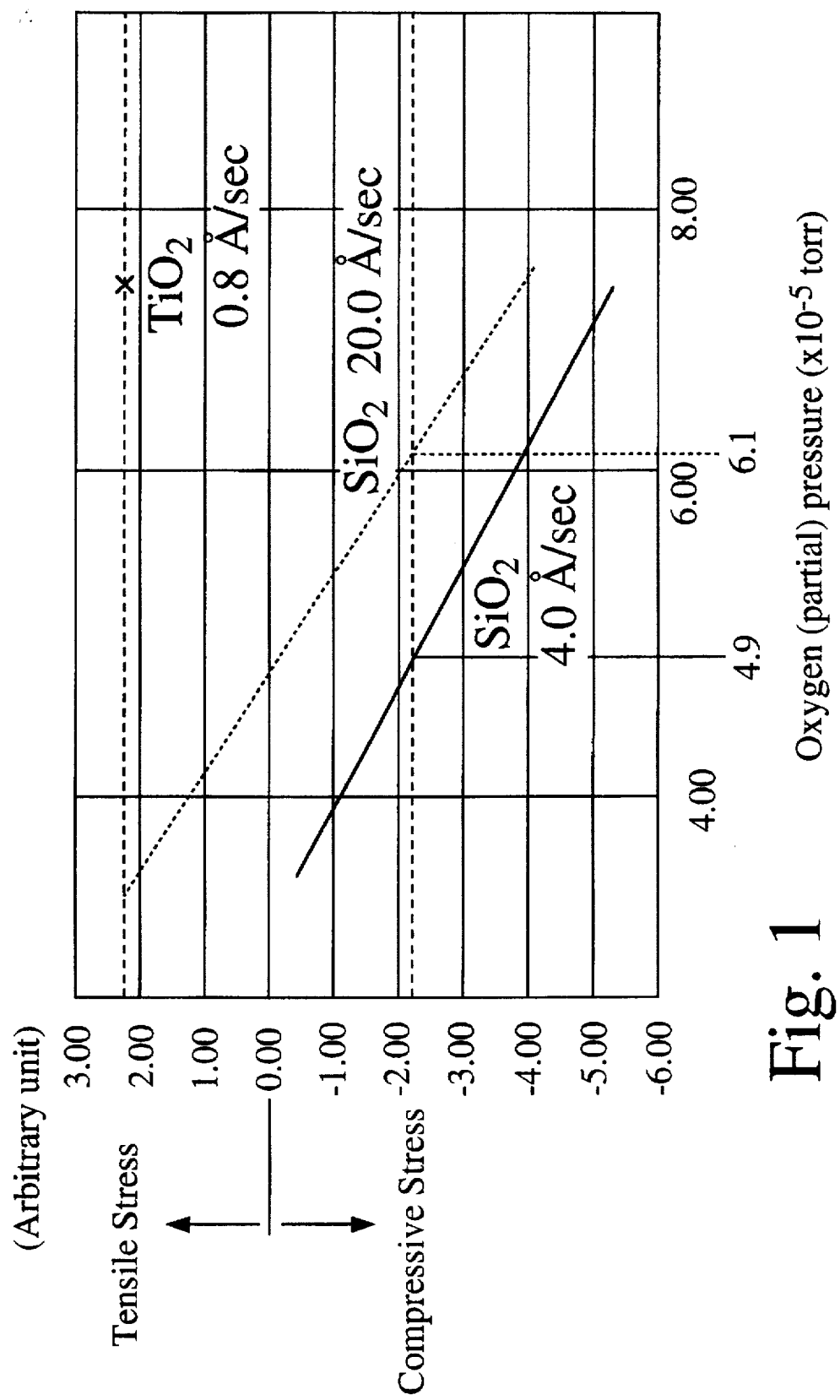
FIG. 1 is a graph that shows the relationship between the amount of compressive stress produced in a first layer of the layer structure and the amount of oxygen (partial) pressure used during fabrication of the first layer in accordance with the invention.

The invention provides a multilayer structure that is fabricated by alternately forming by deposition a first layer and a second layer, each layer having a prescribed thickness, on a semiconductor substrate. Such structure significantly reduces internal strain that arises in the semiconductor substrate.

One embodiment of the invention provides a vertical cavity surface emitting laser in which the reflectivity of the multilayer mirrors (particularly dielectric multilayer mirrors) is increased, while the strain generated in the semiconductor substrate while fabricating the mirrors (particularly, strain produced in the active layer) is significantly decreased. The invention therefore provides a vertical cavity surface emitting laser that can generate either a strong light output or a second harmonic output.

The invention is based, at least in part, on the discovery that strain does not arise in a vertical cavity surface emitting laser after fabricating the multilayer mirrors when the substrate is at a high temperature during mirror fabrication. Accordingly, such strain can be controlled depending upon the mirror fabrication conditions and, in particular, the deposition atmosphere pressure.

Thus, when a multilayer mirror is fabricated on a semiconductor substrate, if the entire multilayer mirror is not compressed or expanded in the direction of the mirror layer surface, the amount of strain introduced into the substrate can be substantially decreased or eliminated. Although discussed herein in connection with the fabrication of a laser, the invention is readily applied to lamination technology in other technical fields.

The multilayer structure herein disclosed is formed by depositing pairs of a first layer and a second layer, each having a prescribed thickness, on a semiconductor substrate. In the preferred embodiment of the invention, when the layers are deposited on the semiconductor substrate, the first layer is formed to exhibit a residual compressive stress, while the second layer is formed to exhibit a residual tensile stress having a magnitude that is equal to or almost equal to the first layer residual compressive stress.

In alternative embodiments of the invention, residual tensile stress may be introduced into the first layer, while residual compressive stress is introduced into the second layer during laser formation. The multilayer structure herein disclosed may also be applied to optical filters, in addition to the mirrors for a vertical cavity surface emitting laser. Additionally, the first layer and the second layer can be formed from materials that may include either dielectrics or semiconductors. Further, a vertical cavity surface emitting laser having a second harmonic generating function may be produced using the techniques herein disclosed.

In the vertical cavity surface emitting laser herein disclosed, the semiconductor substrate is preferably formed from such materials as GaAs or Si. Additionally, the first layer is preferably formed from such materials as SiO$_2$, and the second layer is preferably formed from such materials as TiO$_2$. The first layer is preferably formed by electron beam evaporation in a specific oxygen (partial) pressure atmosphere and at a specific deposition rate. The second layer is preferably formed by electron beam evaporation that is assisted by ion beam irradiation of oxygen or argon, hereinafter referred to as ion beam assist, in a specific oxygen (partial) pressure atmosphere and at a specific deposition rate. The multilayer structure herein disclosed is preferably fabricated as follows:

In the first step, the materials for the first layer and second layer are each selected so that when the first layer is deposited on the prescribed substrate (i.e. the substrate used to measure compressive stress and tensile stress), the stress that arises in said first layer is a compressive stress, and when the second layer is deposited on the prescribed substrate, the stress that arises in said second layer is a tensile stress. The substrate that is used to measure the compressive stress and tensile stress can be a substrate grown from the same material as the semiconductor substrate, as is usual, or it can be another material.

In the vertical cavity surface emitting laser herein disclosed, the multilayer mirror is a structure that is formed from a plurality of pairs of layers comprising a first layer and a second layer (preferably, at least two or four pairs). In the preferred embodiment of the invention, both the first and second layers can be formed from either dielectric materials or from semiconductor materials. In alternative embodiments of the invention, one layer can be formed from a dielectric material, and the other layer can be formed from a semiconductor material. When both the first and second layers are formed from a dielectric material, the first layer can be formed from such material as SiO$_2$, while the second layer may be formed from such material as TiO$_2$.

In the next step, the first and second layers are deposited on the substrate with said prescribed thicknesses. The deposition rate and atmosphere for the first and second layers are selected such that the tensile stress and the compressive stress have the same or almost the same magnitudes. The deposition rate and atmosphere usually differ when depositing the first layer and when depositing the second layer.

When a vertical cavity surface emitting laser having a multilayer mirror consisting of SiO$_2$ layers and TiO$_2$ layers is fabricated, the deposition conditions for the first layer (SiO$_2$) and the second layer (TiO$_2$) are determined as follows:

The deposition temperature (or, alternatively, the semiconductor substrate temperature) is appropriately set. This temperature can be the temperature that is used for the vertical cavity surface emitting laser (usually room temperature) or close to the temperature used for the vertical cavity surface emitting laser. Thus, the generation of strain in the semiconductor substrate, and in the multilayer structure laminated on a semiconductor substrate, as the temperature changes, is prevented.

The TiO$_2$ deposition atmosphere is preferably a suitable oxygen (partial) pressure atmosphere. An ion beam assist is preferably used. In this way, the light absorption rate of the structure can be reduced. Thus, the deposition temperature and the oxygen (partial) pressure for TiO$_2$ are set so that light absorption is minimized. Under these conditions, when TiO$_2$ is formed at the prescribed thickness (for example, a thickness corresponding to l/4, where l is the wavelength of the laser light), tensile stress is created.

The deposition atmosphere and deposition rate for SiO$_2$ are selected to correspond to the tensile stress. That is, when SiO$_2$ is formed at the prescribed thickness (for example, the thickness corresponding to l/4), the oxygen (partial) pressure and deposition rate for the SiO$_2$ layer are selected so that the compressive stress generated has the same magnitude as the tensile stress.

When the thickness of SiO$_2$ is specified, the compressive stress created in the deposited SiO$_2$ layer is a function of the relationship between the deposition rate and the oxygen (partial) pressure. Consequently, if the relationship between the compressive stress and the oxygen (partial) pressure are adjusted beforehand for each deposition rate, the deposition conditions are readily selected so that the tensile stress generated in the TiO$_2$ layer and the compressive stress generated in the SiO$_2$ layer are equal or almost equal.

When depositing the first layer (SiO$_2$), an ion beam assist is not performed. This is because an ion beam assist generates a large tensile stress in the layer being formed, and thereby increases, instead of canceling, the tensile stress in the TiO$_2$ layer.

In the next step, the first and second layers are alternately laminated in succession on the semiconductor substrate as set forth above. Either the first layer first or the second layer can be formed first. When the vertical cavity surface emitting laser herein disclosed includes a multilayer mirror having SiO$_2$ layers and TiO$_2$ layers, deposition of the SiO$_2$ layers and TiO$_2$ layers on the semiconductor substrate (GaAs) is performed by the electron beam method.

In the multilayer structure herein disclosed, compressive stress is generated in the first layer and tensile stress having the same or almost the same magnitude as said compressive stress is generated in the second layer. Therefore, the multilayer structure generates almost no compression or expansion in the direction parallel to the layer surfaces of the semiconductor substrate. In addition, in the vertical cavity surface emitting laser herein disclosed, the strain generated in the laser (particularly in the laser's active layer) after forming the multilayer mirror is significantly reduced. In this way, the threshold can be lowered and high light output or second harmonic output can be obtained.

An embodiment of the invention applied to the dielectric multilayer mirrors in a distributed Bragg reflector (DBR) vertical cavity surface emitting laser is now described. The semiconductor substrate GaAs is used in this embodiment, and deposition is performed by an electron beam evaporation system.

The first step is to select the materials for the first and second layers (dielectric layers). In this embodiment, the materials selected for the first layer and second layer are SiO$_2$ and TiO$_2$, respectively.

Measurement of the compressive stress in the SiO$_2$ layer and the tensile stress in the TiO$_2$ layer is performed by forming SiO$_2$ and TiO$_2$ on the substrate that is used to measure the compressive stress and tensile stress. Here, the GaAs substrate is formed from the same material as the semiconductor substrate as described above.

In the next step, the deposition conditions for the first and second layers are selected. In this embodiment, the deposition conditions for the second dielectric layer (hereinafter, called the TiO$_2$ layer) are determined first to minimize light absorption. The deposition conditions for the first dielectric layer (hereinafter, called the SiO$_2$ layer) are determined next so that the compressive stress that develops is equal to the tensile stress determined by the deposition conditions.

(i) First, l/4-thick TiO$_2$ film is deposited on a GaAs substrate in a specific oxygen (partial) pressure at $3.1 \times 10^{-4}$ torr (background pressure of $1.5 \times 10^{-6}$ torr), while being assisted by an oxygen ion beam having a 50.0 mA ion current and 500 V acceleration voltage. The deposition rate is 0.8 Å/sec. At this time, the substrate is at room temperature (20° C.). The tensile stress in the $TiO_2$ film is measured and is determined to be 2.2 (arbitrary units).

(ii) Next, 1/4-thick $SiO_2$ film is deposited on a GaAs substrate in a special oxygen (partial) pressure. The deposition rate is 4.0 Å/sec. The substrate is at room temperature (20° C.), equal to the temperature when $TiO_2$ is deposited.

Compressive stresses in the $SiO_2$ film are then measured. The measurements of the deposition and the compressive stress are performed multiple times when the oxygen (partial) pressure is changed in various ways under a background pressure of $1.5 \times 10^{-6}$ torr. The relationship between the compressive stress and oxygen (partial) pressure at this time is shown by the solid line in FIG. 1. From FIG. 1 it can be seen that the oxygen (partial) pressure of the $SiO_2$ film becomes $4.9 \times 10^{-5}$ torr when the compressive stress of the $SiO_2$ layer becomes equal to the tensile stress of the $TiO_2$ film.

(iii) Assuming the deposition conditions provide a substrate temperature of 20° C. (room temperature), an oxygen (partial) pressure of $3.1 \times 10^{-4}$ torr, an oxygen ion beam assist current of 50.0 mA, an acceleration voltage of 500 V, and a deposition rate of 0.8 Å/sec for $TiO_2$; and a substrate temperature of 20° C. (room temperature), an oxygen (partial) pressure of $7.2 \times 10^{-5}$ torr, no ion beam assist, and a deposition rate of 4.0 Å/sec for $SiO_2$, then the residual tensile stress in the $TiO_2$ film is nearly equal to the residual compressive stress in the $SiO_2$ film.

In FIG. 1, when the deposition rate of $O_2$ in $SiO_2$ is 20.0 Å/sec, the relationship between the compressive stress and the oxygen (partial) pressure is shown as a dashed line. In this case, the figure shows that an oxygen (partial) pressure of the $SiO_2$ film around $6.1 \times 10^{-5}$ torr is acceptable.

Figure 2A:
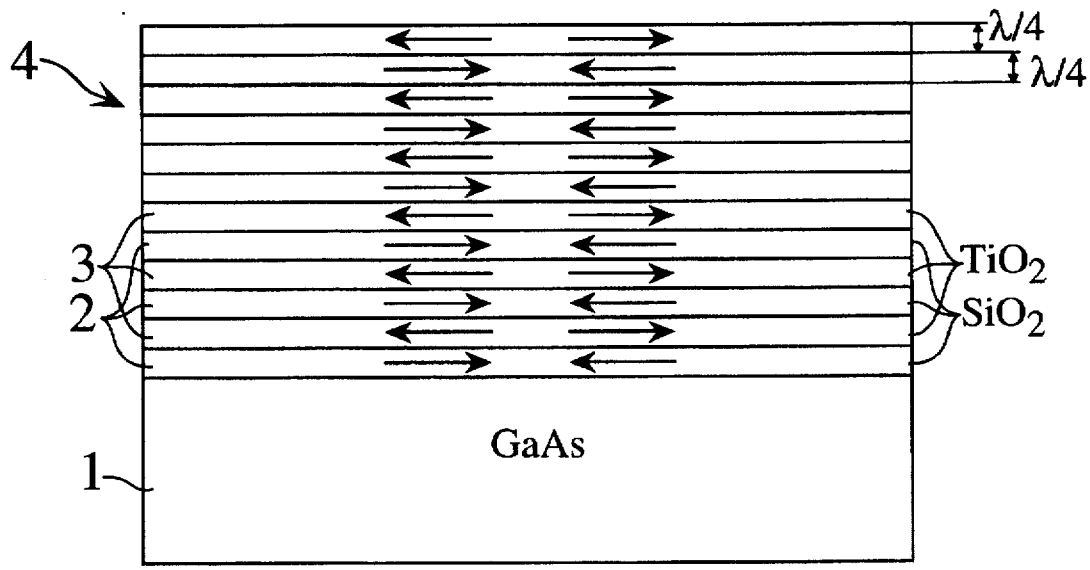
FIG. 2(A) is a schematic diagram showing the dielectric multilayer mirror that is used in a vertical cavity surface emitting laser according to the invention.

FIG. 2(A) is a diagram showing the features of the mirror 4 that was fabricated. Based on the above conditions, the $SiO_2$ layer 2 and $TiO_2$ layer 3 are alternately deposited on the GaAs substrate 1 and form the dielectric multilayer mirror 4.

Figure 2B:
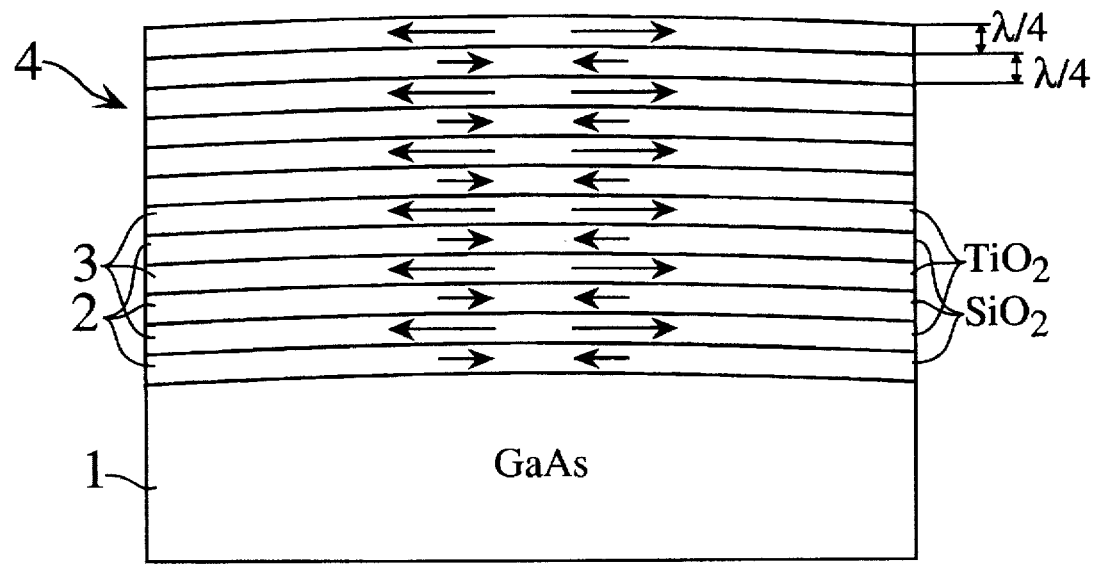
FIG. 2(B) is a schematic diagram showing the dielectric multilayer mirror as used in a conventional vertical cavity surface emitting laser according to the invention.

A conventional dielectric multilayer mirror was formed and is not based on the aforementioned conditions. FIG. 2(B) is a diagram of this mirror.

In both FIGS. 2(A) and (B), six pairs of the $SiO_2$ layer 2 and $TiO_2$ layer 3 are formed. In the figures, the directions of the compressive stress and tensile stress are indicated by the arrows; and the magnitudes of the compressive stress and tensile stress are indicated by the lengths of the arrows.

In the mirror shown in FIG. 2(A), neither compression nor expansion develop in the direction parallel to the layer surfaces because the compressive stress generated in $SiO_2$ film and the tensile stress generated in $TiO_2$ film are almost equal. Therefore, no strain develops in the semiconductor substrate.

In contrast, in the mirror shown in FIG. 2(B), compression and expansion develop in the direction parallel to the layer surfaces because the compressive stress generated in the $SiO_2$ film differs from the tensile stress generated in the $TiO_2$ film. Consequently, strain develops in the semiconductor substrate.

In the embodiment described above, $SiO_2$ and $TiO_2$ are used as the dielectric films, but the invention is not limited to these choices. Dielectric materials in which compressive stress or tensile stress develop after deposition include, for example $Al_2O_3$, MgO, $CaF_2$, and $MgF_2$. Furthermore, in the embodiment described above, deposition is performed at room temperature, but even at temperatures other than room temperature, strain does not develop in the semiconductor substrate, and the same effect as in the embodiment described above can be obtained. However, as described above, because a vertical cavity surface emitting laser is usually used at a temperature close to room temperature, deposition at a temperature close to room temperature is preferred.

In addition, the dielectric multilayer mirror can be used as the mirror on either side of the vertical cavity surface emitting laser, such as a DBR vertical cavity surface emitting laser having a mesa cap structure or a DBR vertical cavity surface emitting laser having a current confinement structure, and as a heat sink mirror.

As described above, the following effects can be obtained according to the invention:

The first and second layers are laminated alternately to form a multilayer film having equal or almost equal residual compressive stress and residual tensile stress. Therefore, the strain that develops in the semiconductor substrate by the compression or expansion in the direction parallel to the layer surfaces in the multilayer film can be reduced significantly.

When the invention is applied to the fabrication of multilayer mirrors in a vertical cavity surface emitting laser, strain in the laser (particularly, in the laser's active layer) can be reduced significantly. Therefore, in addition to reducing absorption by the mirror, the threshold can be decreased, and high light output or second harmonic wave output can be obtained.

If the invention is applied to the mirrors in a vertical cavity surface emitting second harmonic generating element, as is disclosed in U.S. Pat. No. 5,341,390 issued on Aug. 23, 1994 to Yamada et al., the mirror's performance is greatly improved.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. A multilayer structure, comprising:
    a semiconductor substrate; and
    a pair of layers comprising a first layer and a second layer having prescribed thicknesses determined by a desired optical property of said layers, said first and second layers formed by deposition on said semiconductor substrate, wherein said first layer is formed to exhibit a residual compressive stress and said second layer is formed to exhibit a residual tensile stress having a magnitude that is approximately equal to the magnitude of the residual compressive stress of the first layer so that said first layer and said second layer collectively impose a substantially zero stress on said semiconductor substrate.

2. The multilayer structure of claim 1, further comprising:
    a vertical cavity surface emitting laser, wherein said first and second layers are comprised of materials selected from a group of dielectrics and semiconductors.

3. The multilayer structure of claim 2, wherein said multilayer film forms a mirror.

4. The multilayer structure of claim 2, wherein said vertical cavity surface emitting laser comprises a second harmonic generating function.

5. The multilayer structure of claim 1, wherein said semiconductor substrate is comprised of materials selected from a group including GaAs or Si.

6. The multilayer structure of claim 1, wherein said first layer is comprised of materials selected from a group including $SiO_2$.

7. The multilayer structure of claim 1, wherein said second layer is comprised of materials selected from a group including $TiO_2$.

8. The multilayer structure of claim 1, wherein said first layer is formed by electron beam evaporation in a specific oxygen (partial) pressure atmosphere and at a specific deposition rate.

9. The multilayer structure of claim 1, wherein said second layer is formed by electron beam evaporation that is assisted by ion beam irradiation.

10. The multilayer structure of claim 1, wherein deposition of said first and second layers is performed at room temperature.

11. A method for forming a multilayer structure, comprising:

providing a semiconductor substrate; and forming a pair of layers comprising a first layer and a second layer having prescribed thicknesses determined by a desired optical property of said layers, said first and second layers formed by deposition on said semiconductor substrate, wherein said first layer is formed under deposition conditions that generate a residual compressive stress in said first layer, and said second layer is formed under deposition conditions that generate in said second layer a residual tensile stress having a magnitude that is approximately equal to the residual compressive stress of the first layer so that said first layer and said second layer collectively impose a substantially zero stress on said semiconductor substrate.

12. The method of claim 11, wherein said first and second layers are comprised of materials selected from a group of dielectrics and semiconductors.

13. The method of claim 12, wherein said multilayer film forms a mirror.

14. The method of claim 12, wherein said vertical cavity surface emitting laser comprises a second harmonic generating function.

15. The method of claim 11, wherein said semiconductor substrate comprised of materials selected from a group including GaAs or Si.

16. The method of claim 11, wherein said first layer is comprised of materials selected from a group including $SiO_2$.

17. The method of claim 11, wherein said second layer is comprised of materials selected from a group including $TiO_2$.

18. The method of claim 11, wherein said first layer is formed by electron beam evaporation in a specific oxygen (partial) pressure atmosphere and at a specific deposition rate.

19. The method of claim 11, wherein said second layer is formed by electron beam evaporation that is assisted by ion beam irradiation.

20. The method of claim 11, wherein deposition of said first and second layers is performed at room temperature.

* * * * *